United States Patent [19]
Gill

[11] Patent Number: 6,040,961
[45] Date of Patent: *Mar. 21, 2000

[54] CURRENT-PINNED, CURRENT RESETTABLE SOFT AP-PINNED SPIN VALVE SENSOR

[75] Inventor: Hardayal Singh Gill, Portola Valley, Calif.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/957,851

[22] Filed: Oct. 27, 1997

[51] Int. Cl.$^7$ ........................................................ G11B 5/39
[52] U.S. Cl. ........................................................ 360/113
[58] Field of Search ............................ 360/113; 324/252; 338/32 R

[56] References Cited

U.S. PATENT DOCUMENTS

| | | | |
|---|---|---|---|
| 5,701,223 | 12/1997 | Fontana, Jr. et al. | 360/113 |
| 5,748,399 | 5/1998 | Gill | 360/113 |
| 5,768,069 | 6/1998 | Mauri | 360/113 |
| 5,768,071 | 6/1998 | Lin | 360/113 |
| 5,796,561 | 8/1998 | Mauri | 360/113 |

*Primary Examiner*—Jefferson Evans
*Attorney, Agent, or Firm*—William D. Gill

[57] ABSTRACT

A soft anti-parallel (AP)-pinned spin valve (SV) sensor comprising an AP-pinned layer separated from a ferromagnetic free layer by a non-magnetic electrically conducting spacer. The AP-pinned layer includes a first ferromagnetic pinned layer separated from a second ferromagnetic pinned layer by an anti-parallel coupling layer. The second pinned layer further includes a first and second ferromagnetic sub-layers. The first pinned layer which is the farthest pinned layer from the free layer is made of soft (low coercivity) magnetic material. The use of a low coercivity first pinned layer allows the magnetic field generated by the sense current to be used in setting the magnetizations directions of the pinned layer and reset the magnetization direction during the disk operation in the case that the magnetization direction becomes random.

20 Claims, 7 Drawing Sheets

CURRENT-PINNED, CURRENT RESETTABLE SOFT AP-PINNED SPIN VALVE SENSOR

BACKGROUND OF THE INVENTION

1. Field of the Invention

This invention relates generally to magnetic transducers for reading information signals from a magnetic medium and, in particular, to a soft antiparallel pinned spin valve sensor, and to magnetic recording systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic material (e.g., copper) are generally referred to as spin valve (SV) sensors manifesting the GMR effect (also referred to as SV effect). In an SV sensor, one of the ferromagnetic layers, referred to as the pinned layer, has its magnetization typically pinned by exchange coupling with an antiferromagnetic (e.g., NiO or Fe—Mn) layer. The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al. and incorporated herein by reference, discloses an MR sensor operating on the basis of the SV effect.

FIG. 1 shows a prior art SV sensor 100 comprising end regions 104 and 106 separated by a central region 102. A free layer (free ferromagnetic layer) 110 is separated from a pinned layer (pinned ferromagnetic layer) 120 by a non-magnetic, electrically-conducting spacer 115. The magnetization of the pinned layer 120 is fixed by an antiferromagnetic (AFM) layer 121. Free layer 110, spacer 115, pinned layer 120 and the AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensing means 170 connected to leads 140 and 145 sense the change in the resistance due to changes induced in the free layer 110 by the external magnetic field (e.g., field generated by a data bit stored on a disk).

Another type of spin valve sensors currently under development is an anti-parallel (AP)-pinned spin valve sensor. IBM's U.S. Pat. No. 5,583,725 granted to Coffey et al. and incorporated herein by reference, describes an AP-pinned SV sensor (FIG. 2) wherein the pinned layer is a laminated structure of two ferromagnetic layers separated by a nonmagnetic coupling layer such that the magnetizations of the two ferromagnetic layers are strongly coupled together antiferromagnetically in an antiparallel orientation.

Referring to FIG. 2, there is shown a prior art AP-Pinned SV sensor 200 having a free layer 210 separated from a laminated AP-pinned layer 220 by a nonmagnetic, electrically-conducting spacer layer 215. Free layer 210 comprises a Co layer 212 and a Ni—Fe layer 214. The laminated AP-pinned layer 220 comprises a first ferromagnetic layer 222 and a second ferromagnetic layer 226 separated from each other by an antiparallel coupling (APC) layer 224 of nonmagnetic material. The two ferromagnetic layers 222 and 226 in the laminated AP-pinned layer 220 have their magnetization directions oriented antiparallel, as indicated by the head of the arrow 223 pointing out of the plane of the paper and the tail of the arrow 227 pointing into the plane of the paper. Antiferromagnetic (AFM) exchange biasing layers 230 and 232 formed on the lateral extensions 240 and 242 of the free layer 210. The AFM layers 230 and 232 longitudinally bias the free layer so its magnetization in the absence of an external field is in the direction of the arrow 250. Capping layers 260 and 262 provide corrosion resistance for the AFM layers 230 and 232, respectively. Electrical leads 270 and 272 provide electrical connections to current source 280 and a sensing means 285.

Coffey does not use a hard bias layer or an AFM layer adjacent to the pinned layer 220 for pinning the magnetization of the pinned ferromagnetic layer 220. Consequently, Coffey avoids the problems associated with the blocking temperature and/or corrosion of many AFM materials. However, according to Coffey once the sensor geometry is completed the directions of the magnetizations of first and second pinned layers 222 and 226 are set, perpendicular to the air bearing surface (plane of the disk), by applying a sufficiently large magnetic field (about 10 KOe). That is, a large external field is used in order to ensure that the spins are all pinned in the same direction. Once the spins are all pinned in the same direction, Coffey relies on the antiferromagnetic coupling between the two pinned layers 222 and 226 to maintain the pinning. FIGS. 2a and 2b are side views showing the spins directions in the pinned layers 222 and 226 before and after applying a large external field. Before applying a large external field, the spins are randomly formed in both pinned layers 222 and 226 (FIG. 2a). After applying a sufficiently large external field, the directions of the magnetizations in both pinned layers 222 and 226 become set meaning that the spins in each pinned layer become uniform in their directions (FIG. 2b).

However, there are two issues present in Coffey's AP-pinned SV sensor. First, if the magnetizations directions in the pinned layers 222 and 226 becomes disoriented due to a thermal asperity (actual or near contact between the head and the disk) or other unwanted fields (such as the field generated by the write head), there is no means for applying an external field of a large magnitude in the magnetic recording system to reset the directions of the magnetizations of the pinned layers and therefore, the SV sensor becomes inoperative, either partially or completely.

Second, even in the absence of a thermal asperity and/or an unwanted field, the magnetizations directions of the spins in the two pinned layers 222 and 226 rotate in the presence of an unwanted field because Coffey does not provide any means for keeping the directions of magnetizations of the pinned layers perpendicular to the air bearing surface. FIG. 2b shows the magnetizations directions of the spins perpendicular to the air bearing surface. FIGS. 2c and 2d show the directions of the magnetizations of the spins rotated in the presence of an unwanted (external) field such that the magnetizations directions is no longer perpendicular to the air bearing surface.

Rotation of the directions of the magnetizations in the pinned layers 222 and 226 result in read signal asymmetry, unpredictable read signal amplitude and free layer saturation.

Therefore there is a need for an AP-pinned SV sensor in which the directions of magnetizations in the pinned layers can be set by a rather small field, an AP-pinned SV sensor which does not use hard bias or AFM layers for pinning the pinned layers and an AP-pinned SV sensor in which the directions of magnetizations do not rotate in the presence of unwanted fields.

SUMMARY OF THE INVENTION

It is an object of the present invention to disclose a current resettable AP-pinned SV sensor where the sense current may be used to reset the directions of magnetizations in the pinned layers in the event that the pinned layers become disoriented.

It is another object of the present invention to disclose a current-pinned AP-Pinned SV sensor wherein the sense current flowing in the layers of the SV sensor generates a pinning field for pinning the pinned layers.

It is a further object of the present invention to disclose an AP-pinned SV sensor, which is referred to as a Soft AP-Pinned SV sensor, wherein the antiferromagnetically coupled pinned layers comprise low magnetic coercivity materials.

It is still another object of the present invention to disclose a current-resettable, current-pinned soft AP-pinned SV sensor.

It is yet another object of the present invention to disclose an AP-pinned SV sensor wherein the antiferromagnetically coupled pinned layers comprise low anisotropy magnetic materials.

In accordance with the principles of the present invention, there is disclosed a Soft AP-Pinned SV sensor comprising an AP-pinned layer separated from a free ferromagnetic layer by a non-magnetic electrically conducting spacer layer. The AP-pinned layer comprises first and second ferromagnetic pinned layers separated from each other by a non-magnetic antiferromagnetically coupling layer. The first ferromagnetic pinned layer is made of low coercivity material (less than 10 Oe) such as Ni—Fe. The second ferromagnetic pinned layer further comprises first and second ferromagnetic sub-layers where the first sub-layer is preferably made of low coercivity material (less than 10 Oe) such as Ni—Fe and the second sub-layer is made of high coercivity material such as cobalt (Co).

The low coercivity of the first ferromagnetic pinned layer allows for:

(1) setting the directions of the magnetizations in the first and second pinned layers using the field generated by the sense current flowing in the soft AP-pinned SV sensor thus avoiding the use of large external field used by Coffey; and (2) pinning the directions of the magnetizations of the pinned layers perpendicular to the air bearing surface using the field generated by the sense current flowing in the soft AP-pinned SV sensor thus avoiding the rotation of the pinned layers magnetizations directions in the presence of external fields.

Unlike Coffey's AP-pinned SV sensor in which its pinned layers magnetizations directions could not be reset in the magnetic storage device in the event of being disoriented, Applicant's soft AP-pinned SV sensor pinned layers can easily be reset using the field generated by the sense current flowing in the sensor.

Unlike Coffey's AP-pinned SV sensor in which pinned layers magnetizations directions could easily rotate in the presence of external fields, the pinned layers magnetizations directions in Applicant's soft AP-pinned SV sensor is pinned using the field generated by the sense current flowing in the sensor and therefore rotation of the magnetization direction is prevented.

Applicant's invention achieves the aforementioned results by using first ferromagnetic pinned layer which is made of soft ferromagnetic materials. Soft ferromagnetic materials are materials having low coercivity (less than 10 Oe). The low coercivity of the first ferromagnetic pinned layers allows the small field (less than 100 Oe but larger then the coercivity of the soft material) generated by the sense current to both set the directions of the magnetizations in the first and second pinned layers and also reset the directions of the magnetizations in the case that the pinned layers become disoriented.

Applicant's AP-pinned SV sensor is referred to as current resettable current-pinned soft AP-pinned SV sensor because it uses low coercivity ferromagnetic material in building at least the first pinned layer, the directions of the magnetizations can be reset using the field generated by the sense current (because of using a first pinned layer of low coercivity material) and the pinned layers are pinned using the field generated by the sense current (because of using low coercivity material).

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
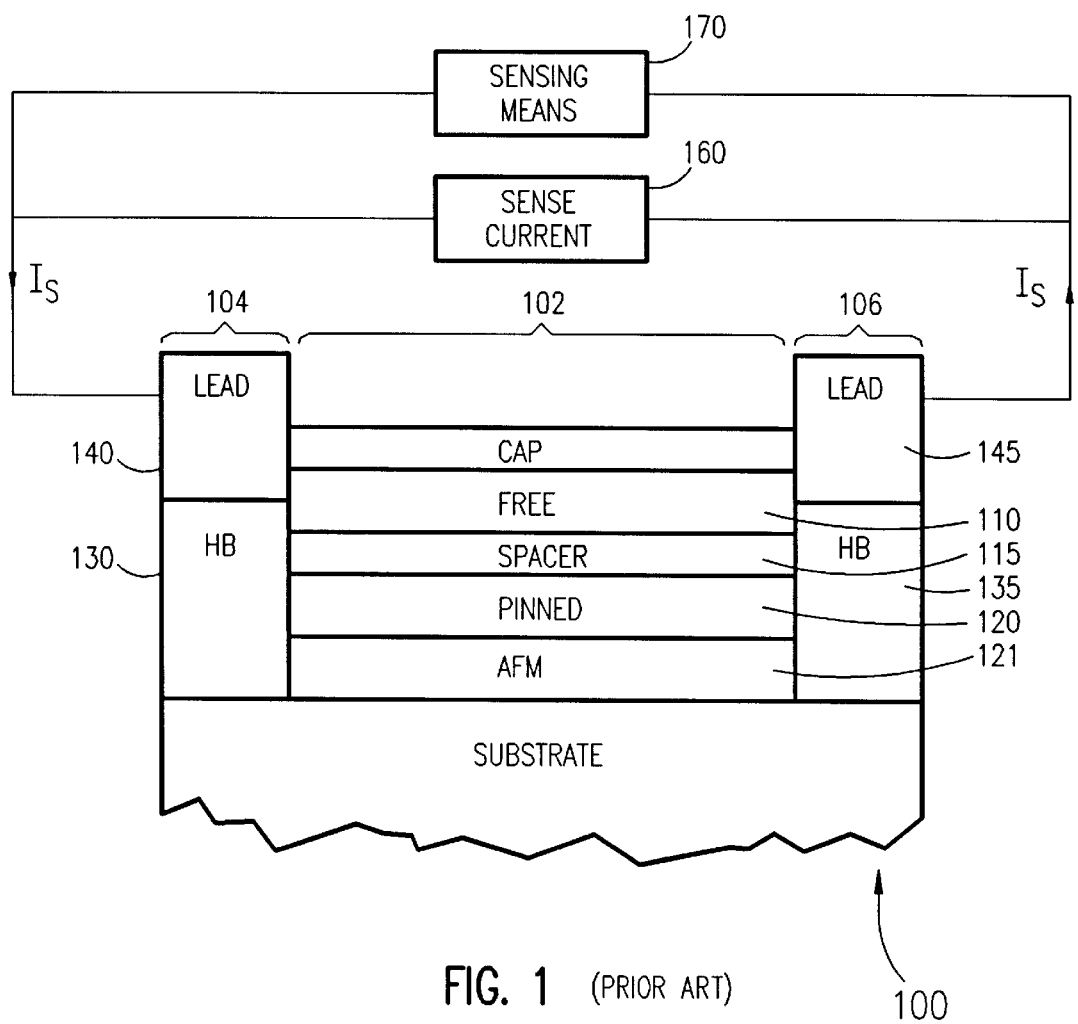
FIG. 1 is an air bearing surface view of a prior art SV sensor.
Figure 2:
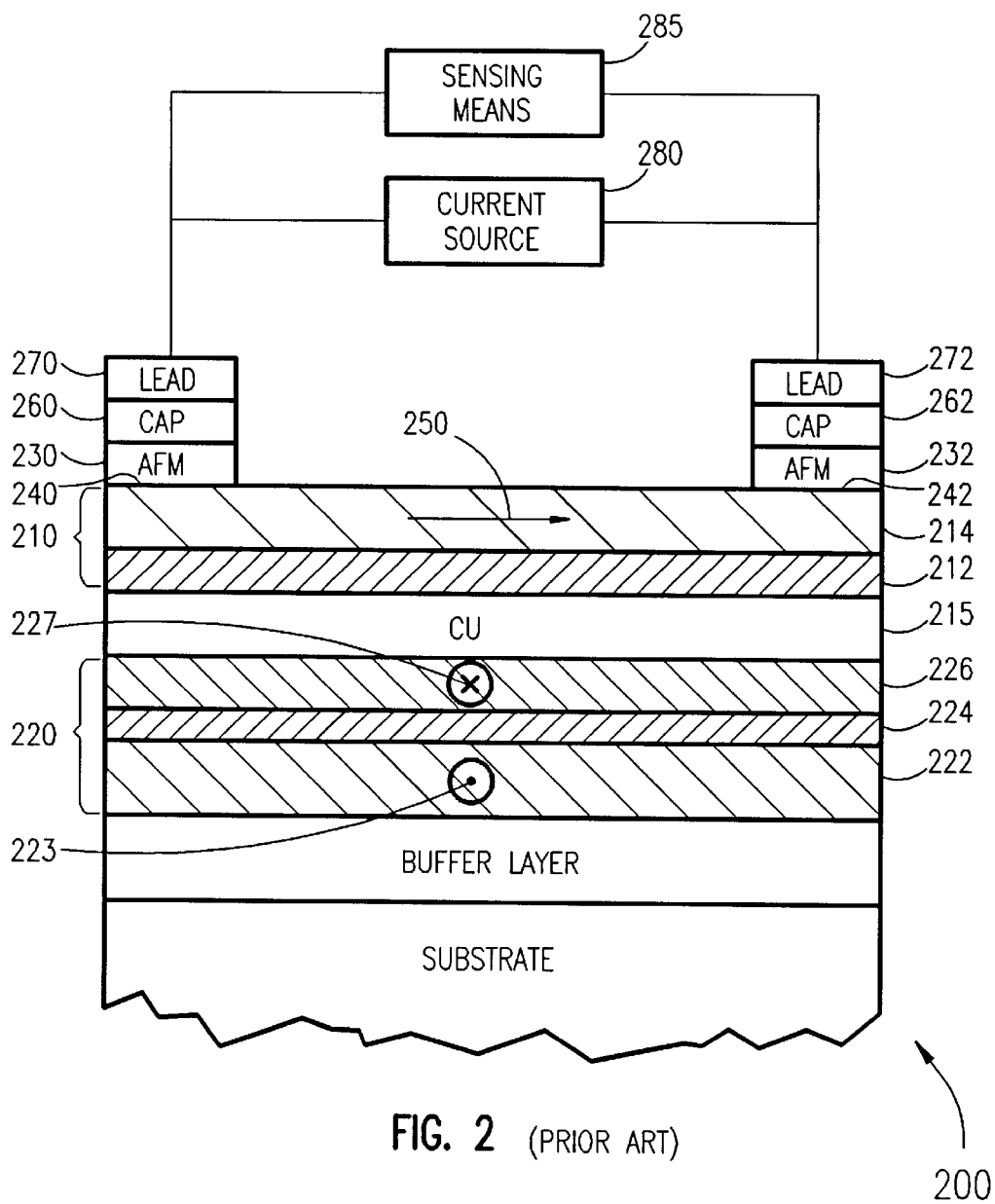
FIG. 2 is an air bearing surface view a prior art AP-Pinned SV sensor.
Figure 2A:
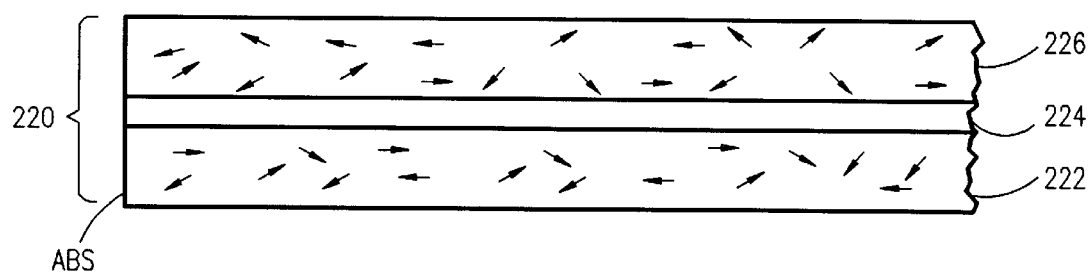
FIGS. 2a–2d are side views of the AP-pinned layer of the SV sensor of FIG. 2.
Figure 2B:
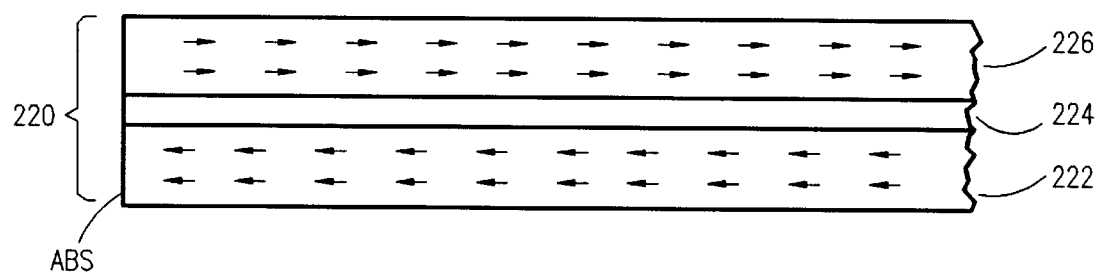
Figure 2C:
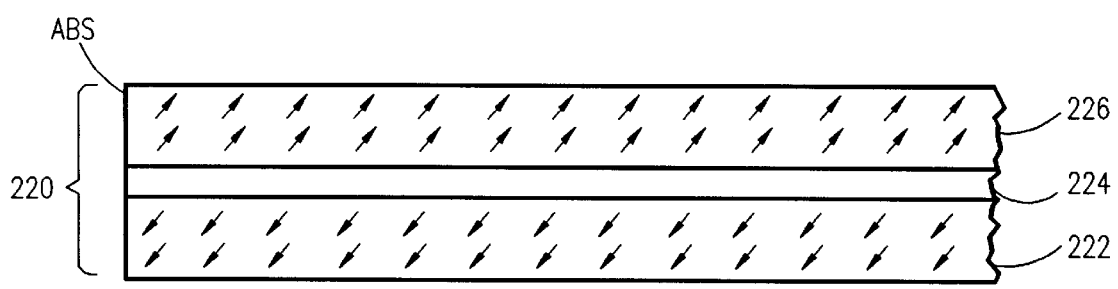
Figure 2D:
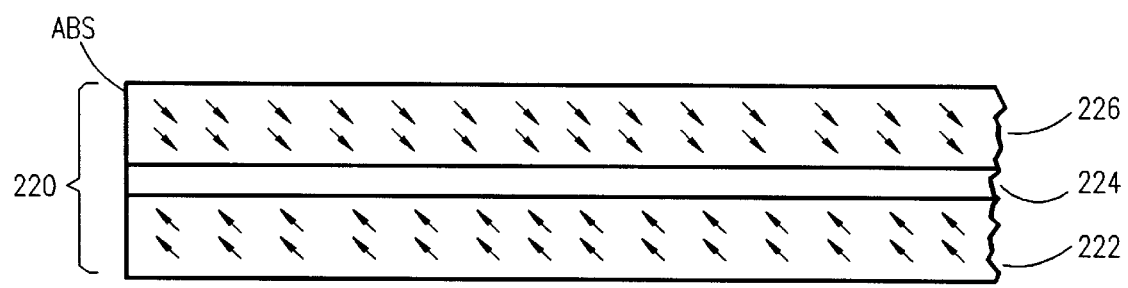
Figure 3:
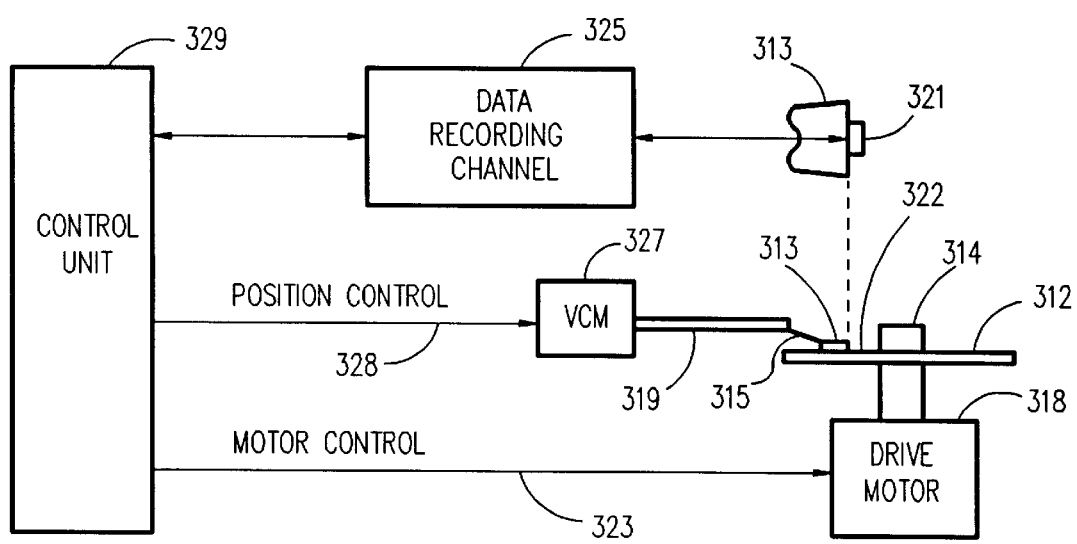
FIG. 3 is a simplified block diagram of a magnetic recording disk drive system incorporating the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
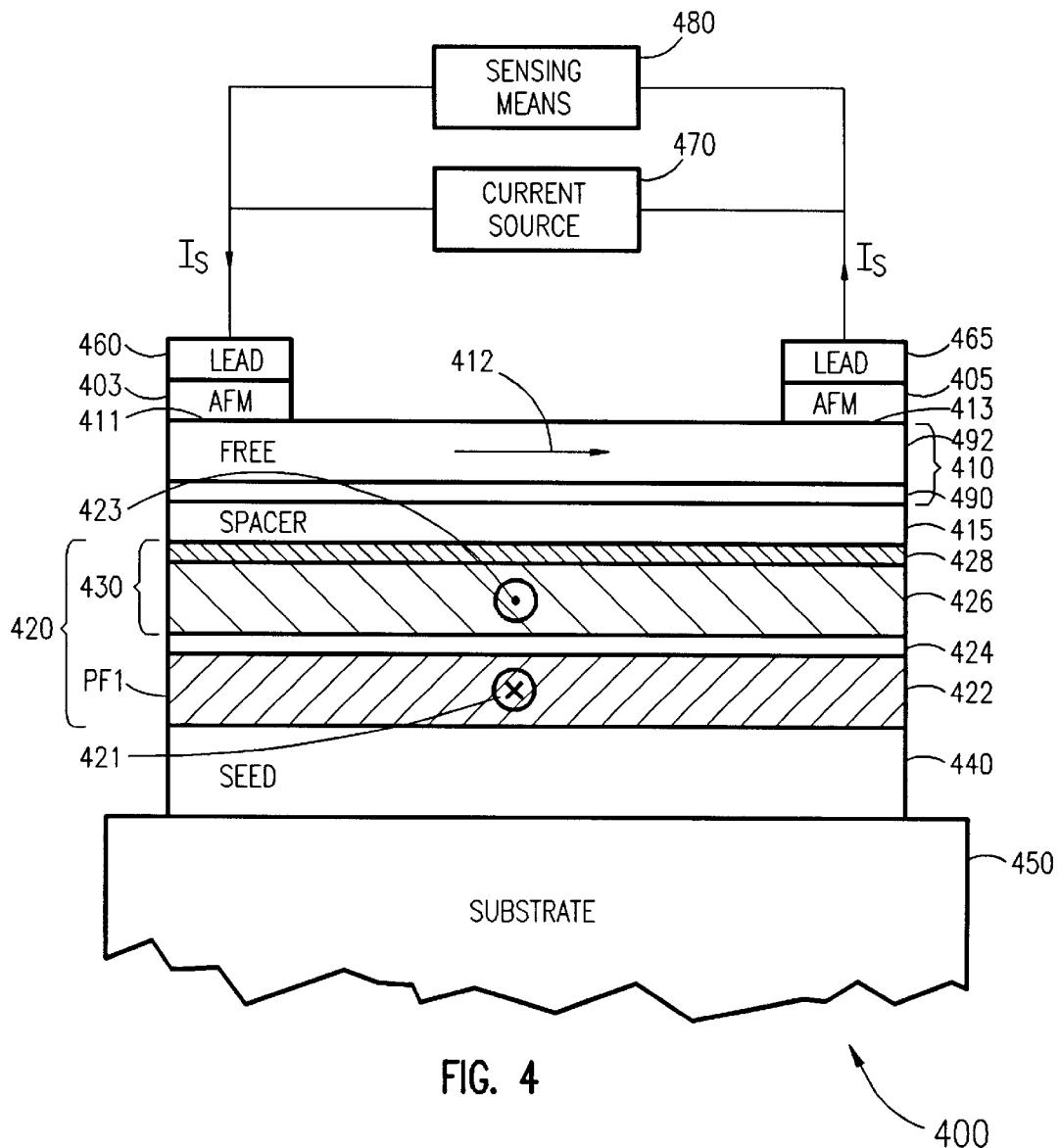
FIG. 4 is an air bearing surface view, not to scale, of the Soft AP-Pinned SV sensor of the present invention.

FIG. 4 shows an air bearing surface (ABS) view of the soft AP-pinned SV sensor 400 according to the preferred embodiment of the present invention. The soft AP-pinned SV sensor 400 comprises a substrate 450 which can be any suitable material, including glass, semiconductor material, or a ceramic material, such as alumina ($Al_2O_3$). The seed layer 440, formed over the substrate 450, is any layer deposited to modify the crystallographic texture or grain size of the subsequent layers, and may not be needed depending on the substrate material. If used, the seed layer may be formed of tantalum (Ta), zirconium (Zr) or $Al_2O_3$. The soft AP-pinned SV sensor 400 further comprises a free ferromagnetic layer 410 separated from an AP-pinned layer 420 by a non-magnetic electrically conducting spacer layer 415. The free layer 410 may further comprises a first and second free sub-layers 490 and 492. respectively. The first sublayer 490 is preferably made of Co and the second free sub-layer 492 is preferably made of Ni—Fe. If free layer 410 is made of single layer, then it may be made of a single layer of Co or a single layer of Ni—Fe. The spacer layer 415 is preferably made of copper (Cu) although it may also be made of gold (Au) or silver (Ag). The AP-pinned layer 420 further comprises a first ferromagnetic pinned layer 422 separated from a second ferromagnetic pinned layer 430 by a non-magnetic antiferromagnetically coupling layer 424. Layer 424 allows the first pinned layer 422 and the second pinned layer 430 to be strongly coupled together antiferromagnetically. The second pinned layer 430 further comprises first and second ferromagnetic sub-layers 426 and 428. In the preferred embodiment of the present invention, the first pinned layer 422 is made of magnetically soft material such as Ni—Fe. First pinned sub-layer 426 is preferably made of low coercivity (less than 10 Oe) material such as NiFe and the second pinned sub-layer 428 is made of generally high coercivity (greater than 100 Oe) material such as a thin layer of Co. The first and second pinned layers 422 and 430 have their magnetization directions oriented antiparallel, as indicated by arrows 421 (arrow's head pointing into the plane of the paper) and 423 (arrow's head pointing out of the plane of the paper). The antiparallel alignment of the magnetizations of the two pinned layers 422 and 430 is due to an antiferromagnetic exchange coupling through the layer 424, preferably made of ruthenium (Ru) although it may also be made of other materials such as iridium (Ir) and rhodium (Rh).

The SV sensor 400 further comprises antiferromagnetic (AFM) layers 403 and 405 formed on lateral extensions 411 and 413, respectively, of the free layer 410 for the purpose of longitudinally biasing the free layer 410. Layers 403 and 405 are preferably made if NiMn although they may also be made of FeMn. In the absence of an applied field, the free layer 410 has its magnetization direction in the direction shown by arrow 412, i.e., generally perpendicular to the magnetizations directions 421 and 423 of the pinned layers 422 and 430 and parallel to the ABS. Leads 460 and 465, formed over the AFM layers 403 and 405, respectively, provide electrical connection between the SV sensor 400 and a sense current 470 and a sensing means 480. Leads 460 and 465 are preferably made of tantalum.

Sensing means 480 comprises a recording channel for reading information sensed by the SV sensor 400. The recording channel may be either analog or digital and is preferably made of a digital channel such as partial-response maximum likelihood as is known in the art. In the preferred embodiment, a magnetic signal in the medium is sensed by the sensing means 480 detecting the change in resistance, deltaR, as the magnetization of the free layer 410 rotates in response to the applied magnetic signal from the recorded medium.

Referring back to FIG. 4, in the preferred embodiment of the present invention, the first pinned layer 422 and the first sub-layer 426 are made of soft (low coercivity) ferromagnetic such that the coercivity of the layers 422 and 426 are less than 10 Oe. The low coercivity of the first pinned layer 422 which is the farthest from the spacer 415, allows the pinned layer 422 magnetization direction be set by the magnetic field from the sense current $I_s$ flowing in the SV sensor 400. The sense current supplied by current source 470 flows through the layers of SV sensor 400 and consequently, the sense current flowing in all the layers in the SV sensor 400 (except for the portion that flows in the first pinned layer 422 itself) provides a magnetic field at the first pinned layer 422 in the range of 10–100 Oe. Since this field is larger than the coercivity of the first pinned layer 422, the field orients and pins the magnetization of the first pinned layer 422 in the direction of the field from the sense current (i.e. essentially perpendicular to the ABS surface). The strong antiferromagnetic coupling through anti-parallel coupling layer 424 pins the directions of the magnetizations of the first and second sub-layers 426 and 428 antiparallel to the first pinned layer 422 magnetization direction. The first pinned sub-layer 426 is preferably made of low coercivity (less than 10 Oe) NiFe while the second sub-layer 428 is made of high coercivity cobalt to ensure a large GMR coefficient.

In the preferred embodiment of the present invention, the thickness of the Co layer 428 is in the range of approximately 1–20 Å and the thickness of the first pinned layer 422 and first pinned sub-layer 426 are in the range of 10–100 Å.

Figure 5:
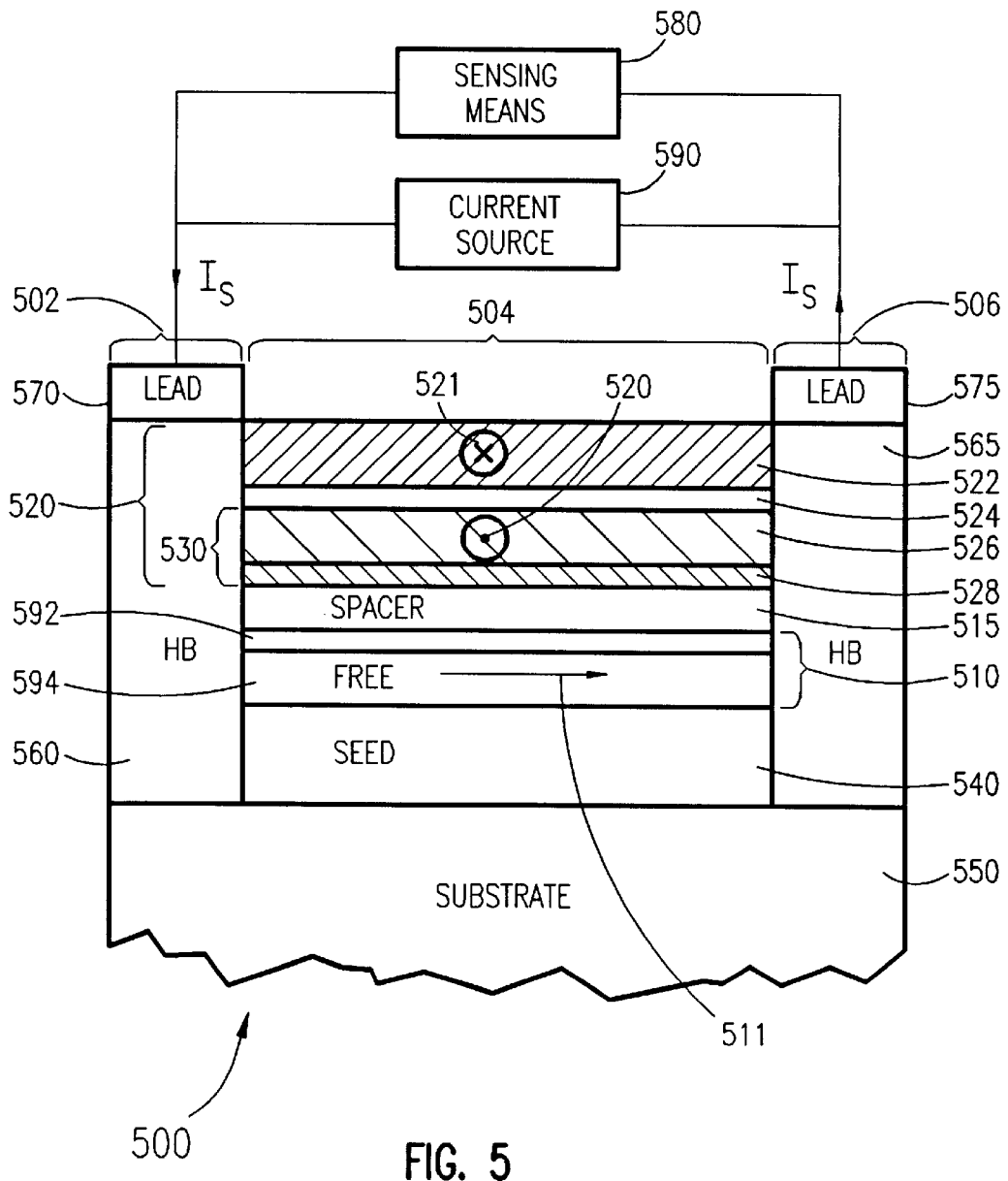
FIG. 5 is an air bearing surface view, not to scale, of an alternate embodiment of the Soft AP-Pinned SV sensor of the present invention.

FIG. 5 shows a soft AP-pinned SV sensor 500 which is an alternative embodiment of the present invention. SV sensor 500 comprises end regions 502 and 506 separated from each other by a central region 504. In this embodiment, the free layer 510 is formed on the seed layer 540. Free layer 510 is separated from AP-pinned layer 520 by the spacer 515. Free layer 510 may comprise first and second free sub-layers 592 and 594, respectively. The AP-pinned layer 520 comprises first ferromagnetic pinned layers 522 separated from a second ferromagnetic pinned layer 530 by an anti-parallel coupling layer 524. The second pinned layer 530 further comprises first and second pinned sub-layers 526 and 528, respectively. The free layer 510, spacer layer 515 and the AP-pinned layer 520 are all formed in the central region 504. Hard bias layers 560 and 565 formed in the end regions 502 and 506, respectively, longitudinally bias the free layer 510. Leads 570 and 575 formed over said hard bias layers 560 and 565, respectively, provide electrical connection between the SV sensor 500 and the sense current 590 and the sensing means 580.

In this alternative embodiment, free layer 510 may be made of a single layer of Co or Ni—Fe. Alternatively, free layer 510 may be a laminated structure having a layer of cobalt (592) and a layer of NiFe (594); spacer 515 may be CU, Au or Ag; anti-parallel coupling layer 524 may be Ru, Rh or Ir; first pinned layer 522 is made of low coercivity (less than 10 Oe) ferromagnetic material such as NiFe; first pinned sub-layer 526 is made of low coercivity ferromagnetic material; second pinned sub-layer 528 is made of high coercivity cobalt; hard bias layers 560 and 565 are made of CoPtCr; and leads 570 and 575 are made of tantalum.

In the absence of an external field (such as a field generated by the information stored on a magnetic storage disk, the free layer 510 magnetization direction 511 is perpendicular to the pinned layers magnetizations directions (parallel to the ABS). In the presence of the magnetic field generated by the sense current 590 flowing in conductive layers of the SV sensor 500, the pinned layers 522 and 526 magnetizations directions will be in the direction of arrows 521 (into the plane of the paper, i.e., perpendicular to the ABS) and 523 (out of the plane of the paper, i.e., perpendicular to the ABS).

In this embodiment, since first pinned layer 522 which is the farthest from the free layer 510 is made of soft (low coercivity, less than 10 Oe) ferromagnetic material such as NiFe, the field generated by the sense current $I_s$ flowing in the SV sensor 500 can be used to set the magnetization direction of the first pinned layer 522 and make the spins to uniformly point to the same desired direction (direction of arrow 521). Once the magnetization direction of the first pinned layer 522 is set, the second pinned layer 530 magnetization direction will also be set uniformly, in the opposite direction (direction of the arrow 523) as a result of strong antiferromagnetic coupling between the two pinned layers.

In the event that during the disk operation, the pinned layer 520 become disoriented (i.e., magnetization direction becomes random) as a result of electrical or mechanical disturbances, once the disturbance has diminished, then the field generated by the sense current $I_s$ will automatically reset the magnetization directions of the pinned layer 520 due to the fact that the first pinned layer 522 is made of low coercivity material.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

I claim:

1. A soft anti-parallel (AP)-pinned spin valve (SV) sensor, comprising:
   a free layer made of cobalt (Co) having a magnetization direction;
   an AP-pinned layer, said AP-pinned layer including:
      a first pinned layer of low coercivity ferromagnetic material;
      a second pinned layer of ferromagnetic material comprising a first sub-layer of low coercivity material and a second sub-layer of high coercivity material, said second sub-layer coercivity being higher than said first sub-layer coercivity and said first pinned layer coercivity; and
      an anti-parallel coupling layer disposed between said first pinned layer and said first sub-layer; and a non-magnetic, electrically conducting spacer layer disposed between said free layer and said second sub-layer.

2. The soft AP-pinned SV sensor as recited in claim 1, wherein said spacer layer is made of copper.

3. The soft AP-pinned SV sensor as recited in claim 1, wherein said spacer layer material is selected from a group of material consisting of copper, gold and silver.

4. The soft AP-pinned SV sensor as recited in claim 1, wherein said anti-parallel coupling layer is made of ruthenium.

5. The soft AP-pinned SV sensor as recited in claim 1, wherein said anti-parallel coupling layer material is selected from a group of material consisting of ruthenium, iridium and rhodium.

6. The soft AP-pinned SV sensor as recited in claim 1, wherein said first pinned layer is made of Ni—Fe.

7. The soft AP-pinned SV sensor as recited in claim 6, wherein said first pinned layer Ni—Fe composition is approximately 81% Ni and 19% Fe.

8. The soft AP-pinned SV sensor as recited in claim 1, wherein said first sub-layer is made of Ni—Fe.

9. The soft AP-pinned SV sensor as recited in claim 8, wherein said first sub-layer Ni—Fe composition is approximately 81% Ni and 19% Fe.

10. The soft AP-pinned SV sensor as recited in claim 1, wherein said second sub-layer is made of cobalt.

11. A disk drive system, comprising:
   a magnetic recording disk;
   an anti-parallel (AP)-pinned spin valve (SV) sensor, comprising:
      a free layer made of cobalt (Co) having a magnetization direction;
      an AP-pinned layer, said AP-pinned layer including:
         a first pinned layer of low coercivity ferromagnetic material;
         a second pinned layer of ferromagnetic material comprising a first sub-layer of low coercivity material and a second sub-layer of high coercivity material, said second sub-layer coercivity being higher than said first sub-layer coercivity and said first pinned layer coercivity; and
      an anti-parallel coupling layer disposed between said first pinned layer and said first sub-layer; and
      a non-magnetic, electrically conducting spacer layer disposed between said free layer and said second sub-layer;
   an actuator for moving said spin valve sensor across the magnetic recording disk so the spin valve sensor may access different regions of magnetically recorded data on the magnetic recording disk; and
   means electrically coupled to the spin valve sensor for detecting changes in resistance of the sensor caused by rotation of the magnetization axis of the free ferromagnetic layer relative to the fixed magnetization direction of said AP-pinned layer in response to magnetic fields from the magnetically recorded data.

12. The disk drive system as recited in claim 11 wherein said spacer layer is made of copper.

13. The disk drive system as recited in claim 11 wherein said spacer layer material is selected from a group of material consisting of copper, gold and silver.

14. The disk drive system as recited in claim 11 wherein said anti-parallel coupling layer is made of ruthenium.

15. The disk drive system as recited in claim 11 wherein said anti-parallel coupling layer material is selected from a group of material consisting of ruthenium, iridium and rhodium.

16. The disk drive system as recited in claim 11 wherein said first pinned layer is made of Ni—Fe.

17. The disk drive system as recited in claim 16 wherein said first pinned layer Ni—Fe composition is approximately 81% Ni and 19% Fe.

18. The disk drive system as recited in claim 11 wherein said first sub-layer is made of Ni—Fe.

19. The disk drive system as recited in claim 18 wherein said first sub-layer Ni—Fe composition is approximately 81% Ni and 19% Fe.

20. The disk drive system as recited in claim 11 wherein said second sub-layer is made of cobalt.

* * * * *